(12) United States Patent
Green et al.

(10) Patent No.: US 8,301,412 B2
(45) Date of Patent: Oct. 30, 2012

(54) METHOD AND APPARATUS FOR MEASURING PERFORMANCE OF HIERARCHICAL TEST EQUIPMENT

(75) Inventors: Eric O. Green, Austin, TX (US); Morgan R. Bickle, Austin, TX (US); Yeo-Ming Sk Koh, Singapore (SG)

(73) Assignee: GLOBALFOUNDRIES Inc., Grand Cayman (KY)

( * ) Notice: Subject to any disclaimer, the term of this patent is extended or adjusted under 35 U.S.C. 154(b) by 549 days.

(21) Appl. No.: 12/411,476

(22) Filed: Mar. 26, 2009

(65) Prior Publication Data

US 2010/0250191 A1    Sep. 30, 2010

(51) Int. Cl.
*G06F 15/00* (2006.01)
(52) U.S. Cl. ........ 702/182; 702/176; 702/177; 702/178; 702/183; 702/184; 702/185; 702/187; 702/188

(58) Field of Classification Search .......... 702/176–178, 702/182–185, 187, 188
See application file for complete search history.

(56) References Cited

U.S. PATENT DOCUMENTS

2003/0023709 A1 *  1/2003  Alvarez et al. ................ 709/223
* cited by examiner

*Primary Examiner* — Sujoy Kundu
(74) *Attorney, Agent, or Firm* — Williams, Morgan & Amerson, P.C.

(57) ABSTRACT

A method includes defining a hierarchy associated with a test system including a plurality of test units for testing integrated circuit devices. At least some of the test units have a plurality of sockets. The hierarchy includes a first level including a first plurality of entities each associated with one of the sockets and at least a second level including a second plurality of entities each associated with a grouping of the sockets. State data associated with operational states of the sockets is received. A set of state metrics is generated for each entity at each level of the hierarchy based on the state data. Each set of state metrics identifies time spent in the operational states.

27 Claims, 4 Drawing Sheets

METHOD AND APPARATUS FOR MEASURING PERFORMANCE OF HIERARCHICAL TEST EQUIPMENT

CROSS-REFERENCE TO RELATED APPLICATIONS

Not applicable.

BACKGROUND OF THE DISCLOSED SUBJECT MATTER

The present subject matter relates generally to semiconductor device testing and, more particularly, to a method and apparatus for measuring performance of hierarchical test equipment.

Semiconductor die are normally formed in large quantities on wafers of semiconductor material, for example, silicon. After die are singulated from the wafers, they may be individually packaged in plastic or ceramic packages, for example. A lead frame may support the die for wire bonding and packaging and provide the lead system for the completed package. In one example, electrical circuitry formed on the die is coupled to bond pads on the die to facilitate interconnection of the electrical circuitry with the outside world. During the wire bonding and packaging process, each bond pad is electrically connected to the lead frame. An encapsulating material protects and insulates the die, and the die is mounted in a package having external pins for interconnecting the electrical circuitry on the die, via the wire bonds, to the outside world.

Packaged devices are typically inserted into sockets on automated test equipment to perform various functional and performance tests prior to delivery to a customer. Test equipment for devices, such as CPUs, has grown dramatically in complexity in recent years as the complexity of CPU designs has also increased dramatically. These new generations of test equipment, such as ATE, and HST (hybrid system level test) in TMP (test mark pack) manufacturing can have as many as 84 sockets (test heads) on a single machine that test asynchronously. A typical testing facility has multiple test tools, each having a plurality of sockets. For a given manufacturing entity, multiple facilities may be used.

Measuring the performance of testers is difficult given the hierarchical machine architectures and the asynchronicity of the testing. Due to the difficulty in monitoring, a manufacturing facility may procure additional testers when capacity needs cannot be met. This procurement is done instead of optimizing the performance of current testers in the facility through detailed analysis of overall equipment efficiency (OEE), resulting in the expenditure of substantial resources for additional test equipment.

This section of this document is intended to introduce various aspects of art that may be related to various aspects of the present subject matter described and/or claimed below. This section provides background information to facilitate a better understanding of the various aspects of the present subject matter. It should be understood that the statements in this section of this document are to be read in this light, and not as admissions of prior art. The present subject matter is directed to overcoming, or at least reducing the effects of, one or more of the problems set forth above.

BRIEF SUMMARY OF THE DISCLOSED SUBJECT MATTER

The following presents a simplified summary of the present subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the present subject matter is seen in a method that includes defining a hierarchy associated with a test system including a plurality of test units for testing integrated circuit devices. At least some of the test units have a plurality of sockets. The hierarchy includes a first level including a first plurality of entities each associated with one of the sockets and at least a second level including a second plurality of entities each associated with a grouping of the sockets. State data associated with operational states of the sockets is received. A set of state metrics is generated for each entity at each level of the hierarchy based on the state data. Each set of state metrics identifies time spent in the operational states.

Another aspect of the present subject matter is seen in a test system including a plurality of test units for testing integrated circuit devices and a performance monitor. At least some of the test units have a plurality of sockets. The sockets are organized in a hierarchy including a first level including a first plurality of entities each associated with one of the sockets and at least a second level including a second plurality of entities each associated with a grouping of the sockets. The performance monitor is operable to receive state data associated with operational states of the sockets and generate a set of state metrics for each entity at each level of the hierarchy based on the state data, each set of state metrics identifying time spent in the operational states.

BRIEF DESCRIPTION OF THE SEVERAL VIEWS OF THE DRAWINGS

The subject matter will be described hereafter with reference to the accompanying drawings, wherein like reference numerals denote like elements, and.

Figure 1:
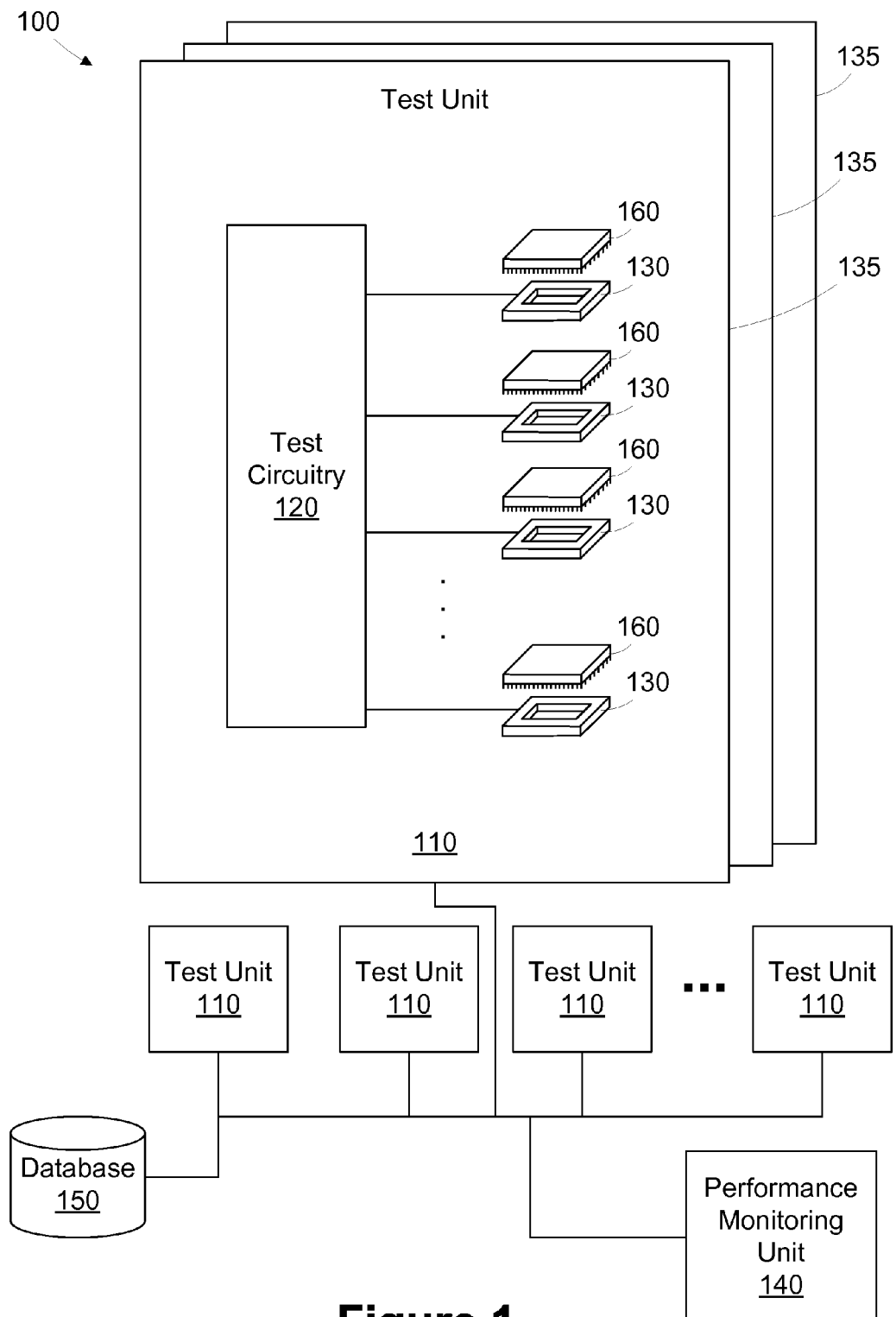
FIG. 1 is a simplified block diagram of a testing system in accordance with one illustrative embodiment of the disclosed subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE DISCLOSED SUBJECT MATTER

One or more specific embodiments of the present subject matter will be described below. It is specifically intended that the present subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present subject matter unless explicitly indicated as being "critical" or "essential."

The present subject matter will now be described with reference to the attached figures. Various structures, systems and devices are schematically depicted in the drawings for purposes of explanation only and so as to not obscure the present subject matter with details that are well known to those skilled in the art. Nevertheless, the attached drawings are included to describe and explain illustrative examples of the present subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present subject matter shall be described in the context of a test system 100. The test system 100 includes a plurality of test units 110, each including test circuitry 120, and a plurality of test sockets 130. Each test unit 110 may include multiple circuit boards 135, each having test circuitry 120 and test sockets 130 mounted thereon. The test units 110 may be located in the same facility or may be distributed amongst multiple facilities in different locations. A performance monitoring unit 140 communicates with the test units 110 for monitoring the performances of the test units 110, and database 150 is provided for storing results from the testing operations and/or the performance monitoring.

A particular test unit 110 receives devices under test 160 in the test sockets 130 and performs testing operations to verify operation or determine performance characteristics of the device under test 160. For ease of illustration and to avoid obscuring features of the illustrative embodiments, not all parts of the test system 100 are depicted. For example, an automated material handler (e.g., robot arm) is typically employed to engage the device under test 160 in one of the test sockets 130. Generally, the particular type of testing performed by the test units 110 is not material to the practice of the embodiments of the present subject matter. Those of ordinary skill in the art are familiar with the testing operations that may be performed and the configuration of the test circuitry 120 required to implement the testing. The test circuitry 120 may be operable to test the devices 160 in parallel or sequentially, synchronously or asynchronously.

Figure 2:
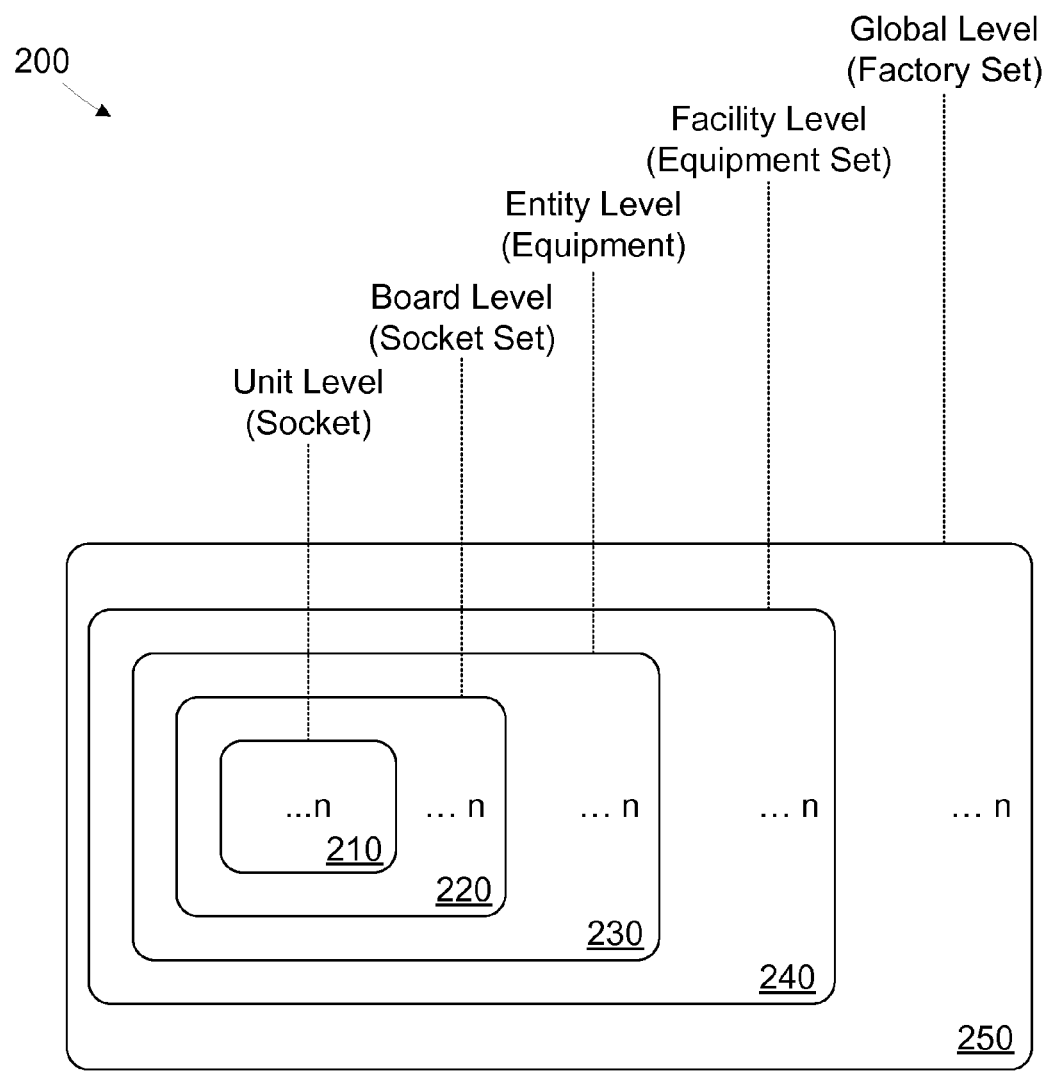
FIG. 2 is a diagram illustrating a hierarchy of entities in the test system of FIG. 1.

Referring briefly to FIG. 2, a diagram illustrating a hierarchy 200 associated with the testing environment. The individual test sockets 130 are represented at a unit level 210. The set of sockets 130 mounted to a particular circuit board 135 are represented by a board level 220. A set of boards 135 in a particular test unit 110 are represented by an entity level 230. The set of test units 110 in a facility are represented by a facility level 240. The set of factories are represented by a global level 250. In general, the performance monitoring unit 140 aggregates the performance of individual sockets 130 and allows the performance to be viewed at the various levels of the hierarchy 200. This multiple level view allows comparison of performance across different boards 135, different test units 110, different facilities, etc.

Figure 3:
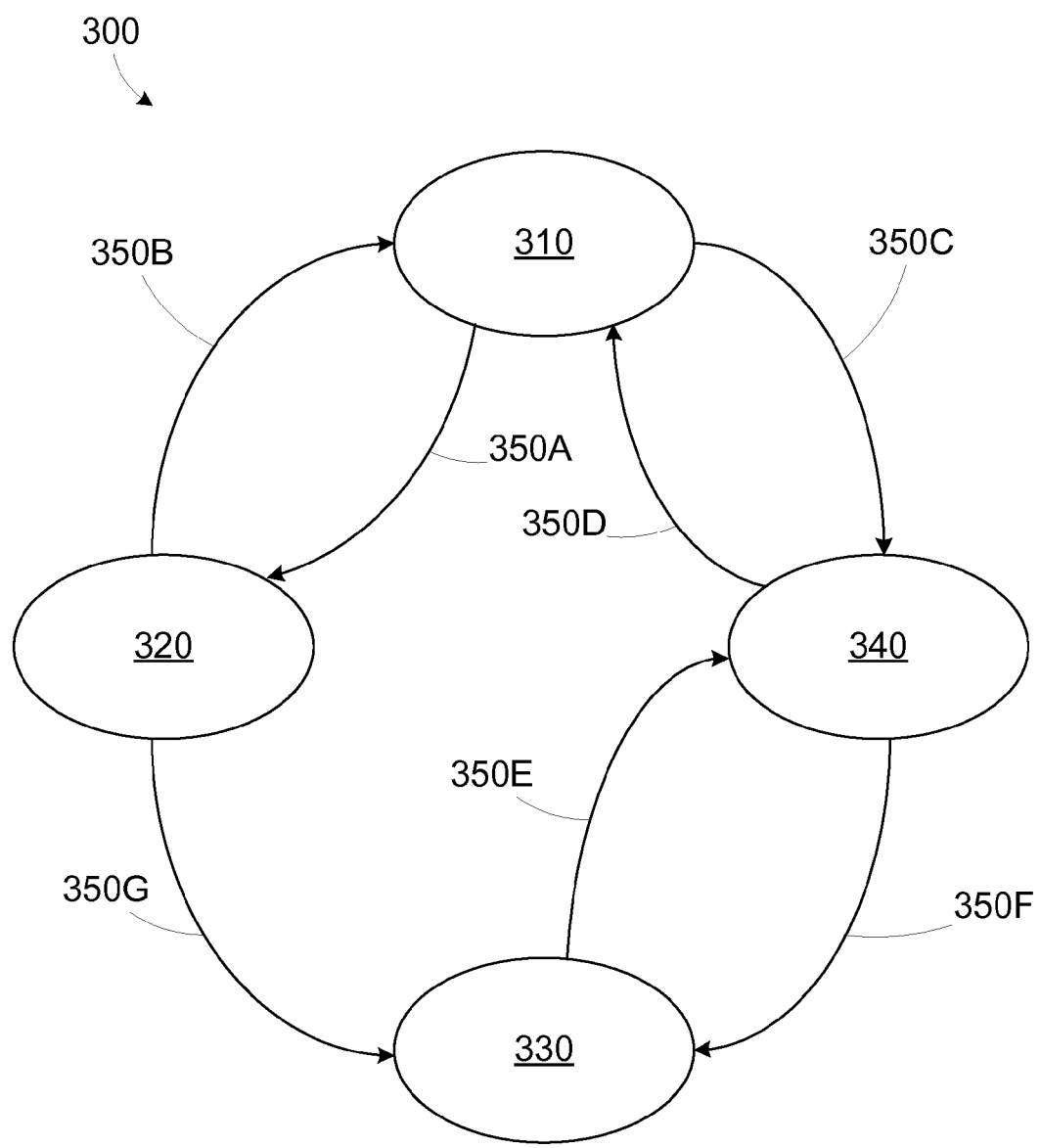
FIG. 3 is a diagram illustrating a socket state model characterizing operation states of sockets in the test system of FIG. 1.

Turning now to FIG. 3, an exemplary socket state model 300 that may be used by the performance monitoring unit 140 is illustrated. The socket state model 300 defines the various operational states 310, 320, 330, 340 that a particular socket 130 may be in at a given moment. The socket state model 300 also illustrates state transitions 350A-G that may occur between the various operational states. As described in greater detail below, the performance monitoring unit 140 monitors state transitions to generate state metrics for sockets 130 at the various levels of the hierarchy 200. Exemplary, but not exhaustive, states illustrated in FIG. 3 include a utilized state (i.e., currently testing a DUT 160), an idle state (i.e., in between tests), a disconnected state (i.e., the socket 130 is off-line, powered down, or otherwise unable to communicate with the test circuitry 120), and a disabled state (i.e., the socket 130 is prevented from operating due to software control or operator input). The number of operational states defined in the socket state model 300 may vary depending on the particular implementation and the type of test unit 110 employed. Additional states are described below and may also be included in the socket state model 300.

Additional operational states may include a rework state that may be entered when a test needs to repeated. A repair state may be entered when an operator, maintenance technician, or engineer identifies that a socket requires repair (i.e., stuck pin, degraded electrical condition, etc.). Other sockets 130 may continue operating pending the repair activity. A calibration state may be entered when a socket 130, board 135, or entire test unit 110 is calibrated during a preventative maintenance activity. A block state may be entered when an operator or the test software blocks the performing of a test. An assist state may be entered when assistance is required for the test unit 110. An operator may initiate an assist state.

Some of the operational states described above may be entered and exited on a socket level, while others may result in transitions for multiple sockets 130 at the board or test equipment level. For example, if a test unit 110 is taken out of service for calibration, all of its sockets 130 may be placed in the calibration state. If a particular board 135 is replaced, its sockets 130 may be placed in a repair state during the repair activity. The other sockets 130 on the other boards 135 may remain operational, and as a result may be in a different state.

Figure 4:
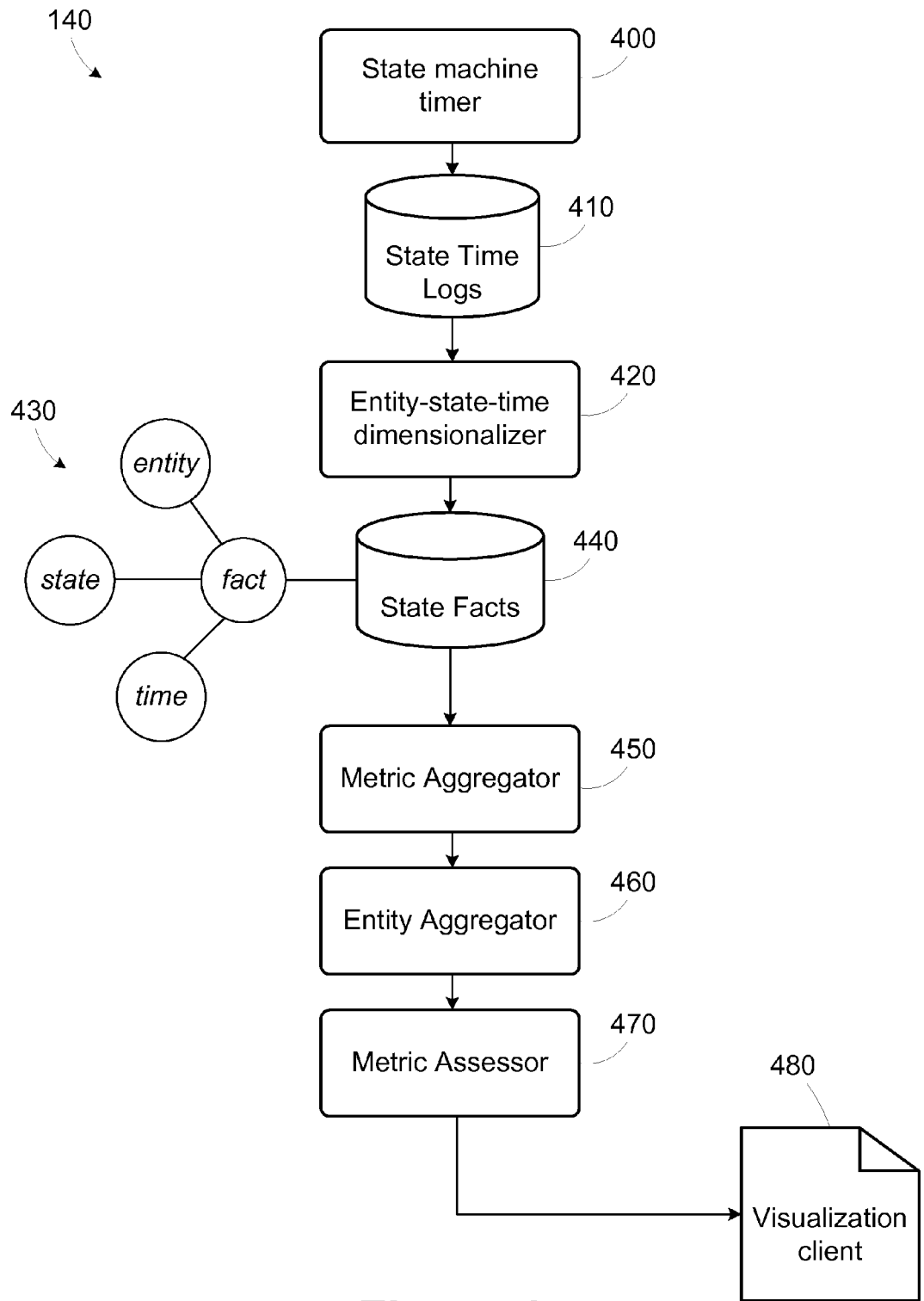
FIG. 4 is a simplified flow diagram illustrating the operation of a performance monitoring unit in the test system of FIG. 1.

One illustrative logical operation of the performance monitoring unit 140 is shown in greater detail in reference to FIG. 4. The performance monitoring unit 140 includes a state machine timer 400 that receives event data from the test units 110 regarding the states of the sockets 130. The state machine timer 400 receives the event data and provides a timestamp indicating the time associated with the state change. The performance monitoring unit 140 stores a state time log in a state time data store 410 (e.g., in the database 150 of FIG. 1).

The performance monitoring unit 140 includes a dimensionalizer 420 that generates entity-state-time facts 430 that document each state change. The dimensionalizer 420 stores the entity-state-time facts 430 in a state fact data store 440 (e.g., in the database 150 of FIG. 1). The dimensionalizer 420 verifies that the indicated state is defined in the socket state model 300 and that the identification of the socket entity (e.g., socket ID, board ID, equipment ID, facility ID) is recognized. The entity-state-time facts 430 use a multi-dimensional (e.g., star) schema for storing the state data. The dimensionalizer 420 manages the state data by automatically adding new entities as they come on line, responding to change-outs of circuit boards 135 and the resulting new sockets 130, and managing the socket state model 300 (i.e., adding or removing dimensions).

The performance monitoring unit 140 includes a metric aggregator 450 that uses the entity-state-time facts 430 to generate a state history for the sockets 130. In general, the entity-state-time facts 430 define the state transitions for the sockets 130. Based on these transitions, the state metrics may be calculated. For example, a metric may be calculated that indicates the percentage of time that each socket is in each operational state. Aggregate metrics may combine one or more state metrics that are similar. For example, a group including the repair, calibration, block, and assist states are similar in that they relate to downtime for the associated socket 130.

The performance monitoring unit 140 may also include an entity aggregator 460 that aggregates the socket metrics across entities in the test system 100. For example, aggregate state metrics may be generated for each board 135, each test unit 110, each facility, or at a global level. A metric accessor 470 may be provided to implement queries to abstract the data structures of the state fact data store 440.

A visualization client 480 may be provided for presenting the state metric results to an operator, engineer, or manager to allow the performance of the test system 100 to be reviewed. The user may specify queries to review state metrics across various entities to judge the effectiveness of process improvement activities or to identify areas where process improvement may be warranted. The visualization client 480 and metric accessor 470 may cooperate to allow a user to specify a query, such as "What was the Facility X's tool utilization for all HST cells for the month of December?" The metric accessor 470 deconstructs the query to identify the facility ID, the type of test unit, the operational state(s), and the time frame. The appropriate results are displayed by the visualization client 480 at the facility level 240 of the hierarchy 200, as the query requested results for the given facility. The user may choose to drill down to different levels of the hierarchy 200 to identify how the underlying entities contributed to the overall utilization metric.

In some embodiments, the visualization client 480 may be operable to implement fault detection and classification activities. For example, if the utilization metrics for a given board, tool, facility, etc. differ significantly from similarly situated entities, the suspect entities may be flagged for investigation. Degraded sockets 130, boards 135, or test units 110 may be identified automatically by the visualization client 480. Alternatively, a different FDC module may be provided to automatically analyze the results, or the user may identify suspect entities based on the reviewed results.

The performance monitoring unit 140 provides the ability to realize measurement and aggregation of the hierarchical entities of the test system 100. This ability facilitates sophisticated visualization and business intelligence techniques to allow review across all of the levels in the hierarchy (e.g., global, facility, entity, board, and socket). The data may be evaluated at a global operation level and then drilled down to a faulty component on a single piece of equipment.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
defining a hierarchy associated with a test system including a plurality of test units for testing integrated circuit devices, at least some of the test units having a plurality of sockets, the hierarchy including a first level including a first plurality of entities each associated with one of the sockets and at least a second level including a second plurality of entities each associated with a grouping of the sockets;
receiving state data associated with operational states of the sockets in a computing apparatus; and
generating a set of state metrics in the computing apparatus for each entity at each level of the hierarchy based on the state data, each set of state metrics identifying time spent in the operational states.

2. The method of claim 1, wherein at least some of the test units have multiple circuit boards with sockets being mounted to each circuit board, and each entity in the second plurality of entities corresponds to a set of sockets on a particular one of the circuit boards.

3. The method of claim 2, wherein the hierarchy includes a third level including a third plurality of entities, and each entity in the third plurality of entities corresponds to a set of circuit boards in a particular one of the test units.

4. The method of claim 3, wherein the test units in the test system are distributed throughout a plurality of facilities, the hierarchy includes a fourth level including a fourth plurality of entities, and each entity in the fourth plurality of entities corresponds to a set of test units in a particular one of the facilities.

5. The method of claim 4, wherein the hierarchy includes a fifth level including a global entity corresponding to a set of facilities in the test system.

6. The method of claim 1, wherein each entity in the second plurality of entities corresponds to a particular one of the test units.

7. The method of claim 1, wherein the state data comprises state transition data indicating transitions between the operational states for particular sockets.

8. The method of claim 7, further comprising:
defining a socket state model identifying the operational states and state transitions between the operational states; and
tracking the transitions in accordance with the socket state model.

9. The method of claim 7, further comprising generating a state transition fact for each of the transitions, the state transition fact including an entity identifier, a particular operational state, and a timestamp.

10. The method of claim 7, wherein the state transition data identifies a selected transition for a subset of the sockets.

11. The method of claim 10, further comprising generating a state transition fact for each of the sockets in the subset associated with the selected transition, the state transition fact including an entity identifier, a particular operational state, and a timestamp.

12. The method of claim 1, wherein generating the set of state metrics comprises aggregating state metrics generated for entities in a particular level to generate state metrics for entities in a higher level in the hierarchy.

13. The method of claim 1, further comprising generating a report identifying at least a subset of the state metrics.

14. A system, comprising:
a plurality of test units for testing integrated circuit devices, at least some of the test units having a plurality of sockets, the sockets being organized in a hierarchy including a first level including a first plurality of entities each associated with one of the sockets and at least a second level including a second plurality of entities each associated with a grouping of the sockets;
a performance monitor operable to receive state data associated with operational states of the sockets and generate a set of state metrics for each entity at each level of the hierarchy based on the state data, each set of state metrics identifying time spent in the operational states.

15. The system of claim 14, wherein at least some of the test units have multiple circuit boards with sockets being mounted to each circuit board, and each entity in the second plurality of entities corresponds to a set of sockets on a particular one of the circuit boards.

16. The system of claim 15, wherein the hierarchy includes a third level including a third plurality of entities, and each entity in the third plurality of entities corresponds to a set of circuit boards in a particular one of the test units.

17. The system of claim 16, wherein the test units in the test system are distributed throughout a plurality of facilities, the hierarchy includes a fourth level including a fourth plurality of entities, and each entity in the fourth plurality of entities corresponds to a set of test units in a particular one of the facilities.

18. The system of claim 17, wherein the hierarchy includes a fifth level including a global entity corresponding to a set of facilities in the test system.

19. The system of claim 14, wherein each entity in the second plurality of entities corresponds to a particular one of the test units.

20. The system of claim 14, wherein the state data comprises state transition data indicating transitions between the operational states for particular sockets.

21. The system of claim 20, wherein the performance monitoring unit is operable to employ a socket state model identifying the operational states and state transitions between the operational states and track the transitions in accordance with the socket state model.

22. The system of claim 20, wherein the performance monitoring unit is operable to generate a state transition fact for each of the transitions, the state transition fact including an entity identifier, a particular operational state, and a timestamp.

23. The system of claim 20, wherein the state transition data identifies a selected transition for a subset of the sockets.

24. The system of claim 23, wherein the performance monitoring unit is operable to generate a state transition fact for each of the sockets in the subset associated with the selected transition, the state transition fact including an entity identifier, a particular operational state, and a timestamp.

25. The system of claim 14, wherein the performance monitoring unit is operable to generate the set of state metrics by aggregating state metrics generated for entities in a particular level to generate state metrics for entities in a higher level in the hierarchy.

26. The system of claim 14, wherein the performance monitoring unit is operable to generate a report identifying at least a subset of the state metrics.

27. A system, comprising:
means for defining a hierarchy associated with a test system including a plurality of test units for testing integrated circuit devices, at least some of the test units having a plurality of sockets, the hierarchy including a first level including a first plurality of entities each associated with one of the sockets and at least a second level including a second plurality of entities each associated with a grouping of the sockets;
means for receiving state data associated with operational states of the sockets; and
means for generating a set of state metrics for each entity at each level of the hierarchy based on the state data, each set of state metrics identifying time spent in the operational states.

* * * * *